United States Patent
Lin et al.

(10) Patent No.: US 6,372,661 B1
(45) Date of Patent: Apr. 16, 2002

(54) METHOD TO IMPROVE THE CRACK RESISTANCE OF CVD LOW-K DIELECTRIC CONSTANT MATERIAL

(75) Inventors: Cheng Chung Lin, Taipei; Shwang Ming Jeng, Hsin-Chiu; Lain Jong Li, Hwa-Liang, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 95 days.

(21) Appl. No.: 09/617,011

(22) Filed: Jul. 14, 2000

(51) Int. Cl.$^7$ .................. H01L 21/31; H01L 21/469

(52) U.S. Cl. .................. 438/769; 438/680; 438/769; 438/954; 257/639; 501/87

(58) Field of Search .................. 438/658, 719, 438/769, 954, 680; 257/639; 501/87

(56) References Cited

U.S. PATENT DOCUMENTS

| | | | |
|---|---|---|---|
| 5,300,460 A | 4/1994 | Collins et al. | 437/225 |
| 5,530,581 A * | 6/1996 | Cogan | 359/265 |
| 5,661,093 A | 8/1997 | Ravi et al. | 438/763 |
| 5,804,259 A | 9/1998 | Robles | 427/577 |
| 5,926,740 A | 7/1999 | Forbes et al. | 437/763 |
| 6,054,379 A * | 4/2000 | Yau et al. | 438/623 |
| 6,159,871 A * | 12/2000 | Loboda et al. | 438/786 |
| 6,284,149 B1 * | 9/2001 | Li et al. | 216/64 |
| 6,303,523 B2 * | 10/2001 | Cheung et al. | 438/780 |

FOREIGN PATENT DOCUMENTS

WO    WO99/63591    * 5/1998 ......... H01L/21/768

OTHER PUBLICATIONS

Press release—"International Sematech Validates Manufacturing Capability of Applied Materials's Low–k Solution for Copper Interconnects Successful Results Achieved with Black Diamond for Production of Sub. 0.18 Micron Chips," Applied Materials, Feb. 28, 2000.

* cited by examiner

*Primary Examiner*—Caridad Everhart
*Assistant Examiner*—Granvill D Lee, Jr.
(74) *Attorney, Agent, or Firm*—George O. Saile; Stephen B. Ackerman; Stephen G. Stanton

(57) ABSTRACT

A method of fabricating a CVD low-k SiOCN material. The first embodiment comprising the following steps. $MeSiH_3$, $N_2O$, and $N_2$ are reacted at a molar ratio of from about 1:5:10 to 1:10:15, at a plasma power from about 0 to 400 W to deposit a final deposited film. The final deposited film is treated to stabilize the final deposited film to form a CVD low-k SiOCN material. The second embodiment comprising the following steps. A starting mixture of $MeSiH_3$, $SiH_4$, $N_2O$, and $N_2$ is reacted at a molar ratio of from about 1:1:5:10 to 1:5:10:15, in a plasma in a helium carrier gas at a plasma power from about 0 to 400 W to deposit a CVD low-k SiOCN material.

32 Claims, 3 Drawing Sheets

METHOD TO IMPROVE THE CRACK RESISTANCE OF CVD LOW-K DIELECTRIC CONSTANT MATERIAL

FIELD OF THE INVENTION

The present invention relates generally to fabricating semiconductor devices and specifically to methods of forming low dielectric constant (low-k) materials used in fabricating semiconductor devices.

BACKGROUND OF THE INVENTION

Advances in IC technology has further decreased the design rule, or device size, in semiconductor device fabrication. To that end, inter-layer and intermetal layers, or films, within semiconductor devices are sought that have low dielectric constants to improve performance and reliability of such devices.

The press release entitled "International Sematech Validates Manufacturing Capability of Applied Material's Low-k Solution for Copper Interconnects—Successful Results Achieved with BLACK DIAMOND for Production of Sub-0.18 Micron Chips," Applied Materials, Feb. 28, 2000, describes a successful evaluation of Applied Materials, Inc.'s BLACK DIAMOND™ material (a family of low-k products deposited using the DLK chamber) for production of advanced interconnect structures in copper sub-0.18 micron devices.

U.S. Pat. No. 5,661,093 to Ravi et al. describes a method for depositing a halogen-doped oxide film having a low dielectric constant that is resistant to outgassing of the halogen dopant and moisture absorption, and also retains these properties during subsequent processing steps. A halogen-doped layer is deposited by introducing process gasses into a processing chamber, including a halogen-containing source gas. The process gas combination is changed and a sealing layer is deposited that seals the dopant within the halogen-doped layer. The sealing layer may be comprised of a carbon-rich layer or an undoped layer.

U.S. Pat. No. 5,926,740 to Forbes et al. describes a method of forming a graded anti-reflective coating (ARC) for integrated circuit (IC) lithography. A substantially continuously graded composition silicon oxycarbide (SiOC) anti-reflective coating or anti-reflective layer (ARL) is interposed between a photoresist layer and an underlying substrate. The ARC composition is graded from SiOC at the ARC—photoresist interface, to SiC or Si in a direction away from the photoresist. Reflections at the ARC-photoresist interface are substantially eliminated, substantially all incident light, including UV and DUV light, is absorbed in the ARC, and substantially no light reaches or is reflected from the underlying substrate. Photolithographic limitations such as swing effect and reflective notching are reduced.

U.S. Pat. No. 5,804,259 to Robles describes a method of forming a multilayer insulating film on a substrate by forming a number of carbon-based layers on the substrate. Each such layer interlaid with layers of organic material such as parylene. The carbon-based layers are preferably formed using a high-density plasma (HDP) chemical vapor deposition (CVD) although other CVD systems may be used.

U.S. Pat. No. 5,300,460 to Collins et al. describes an ultra-high frequency (UHF)/very-high frequency (VHF) plasma used in forming IC structures. The UHF/VHF plasma is generated by a UHF/VHF power source at a frequency from about 50 to 800 MHz. Low or high pressure plasma-assisted etching or deposition processes at respective pressure limitations. The electrode sheath voltages are maintained sufficiently low so as to avoid damaging wafer structures yet high enough to permit initiation of the processes without the need for supplemental power sources. Microloading effects may also be reduced or eliminated by operating within the 50 to 800 MHz frequency range.

SUMMARY OF THE INVENTION

Accordingly, it is an object of the present invention to provide a method of forming CVD low dielectric constant material having improved crack resistance.

Another object of the present invention is to provide a method of forming up to and over 3 μm thick CVD low dielectric constant material having improved crack resistance.

Yet another object of the present invention is to provide a method of forming improving the crack resistance of CVD low dielectric constant material having without sacrificing the low dielectric constant characteristic of the material.

Other objects will appear hereinafter.

It has now been discovered that the above and other objects of the present invention may be accomplished in the following manner. Specifically, in the first embodiment, $MeSiH_3$, $N_2O$, and $N_2$ are reacted at a molar ratio of from about 1:2:10 to 1:10:15, at a pressure from about 0.3 to 4 torr, at a temperature from about 17 to 400° C., and at a plasma power from about to 400 watts (W), and more preferably from about 200 to 300 W, to deposit a final deposited film. The final deposited film is then treated to stabilize the final deposited film to form a CVD low-k SiOCN material. In the second embodiment, a starting mixture of $MeSiH_3$, $SiH_4$, $N_2O$, and $N_2$ is reacted at a molar ratio of from about 1:1:2:10 to 1:5:10:15, at a pressure from about 0.3 to 4 torr, at a temperature from about 380 to 420° C., and in a plasma in a helium carrier gas at a plasma power from about 0 to 400 W, and more preferably from about 200 to 300 W, to deposit a CVD low-k SiOCN material.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Problem Discovered by the Inventors

Figure 1:
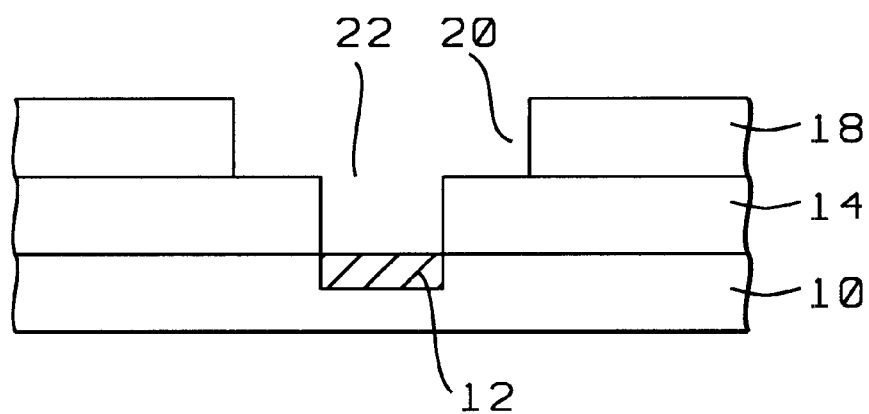
FIG. 1 schematically illustrates in cross-sectional representation a multi-layer stack CVD low-k material dual damascene structure.
Figure 2:
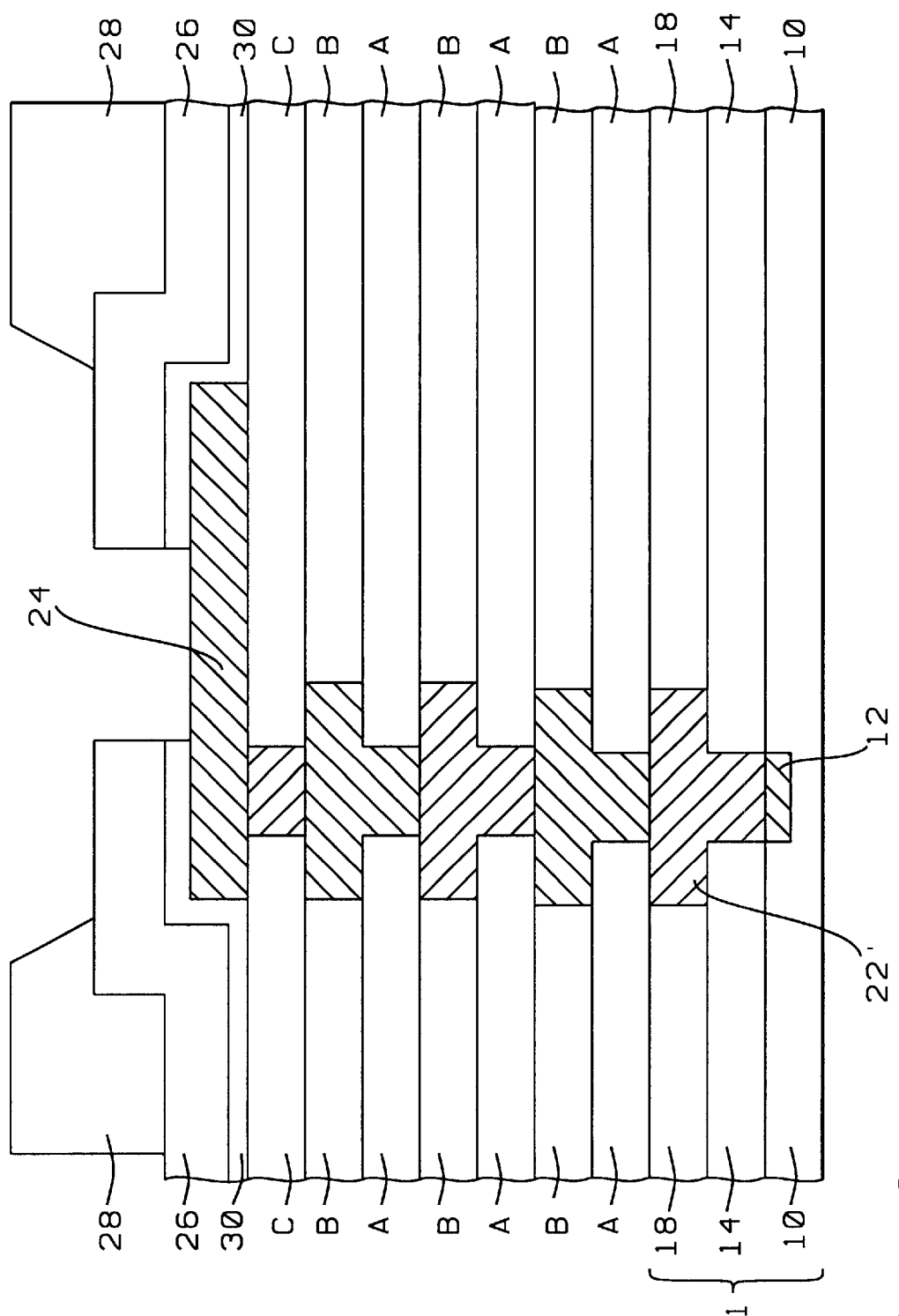
FIG. 2 schematically illustrates in cross-sectional representation a reduced view of the multi-layer stack CVD low-k material dual damascene structure of FIG. 1, with other similar dual damascene structures formed thereover and electrically interconnecting with, and terminating in, a bonding pad.

FIGS. 1 and 2 illustrate a problem known to the inventors in forming a multi-layer stack of known CVD low-k material. This is not prior art for the patentability of the invention. This illustrates a problem the invention solves.

The inventors has discovered that current CVD low-k materials, for example BLACK DIAMOND™ material (BD) developed by Applied Materials, used to fabricate semiconductor structures crack after six layers of dual damascene stacking. Thus the cracking threshold is less than about 2 μm.

FIG. 1 illustrates a single dual damascene structure. That is, semiconductor structure 10 has an exposed metal line 12, for example. A first layer 14 of low-k material, e.g. silicon oxycarbide (SiOC), is formed over semiconductor structure 10, generally by a chemical vapor deposition (CVD) process. Second layer 18 of low-k material is then formed over first layer 14 also by a CVD process.

Second layer 18 and first layer 14 are patterned to form trench opening 20 within second layer 18, and via opening 16 within first layer 14 and within trench opening 20 exposing a portion of underlying metal line 12. Regardless of the exact process used, trench opening 20 and via opening 16 together form a dual damascene opening 22 within which a conductive metal layer, now preferably copper, is formed to form a planarized dual damascene structure 22' (see FIG. 2).

As shown in FIG. 2, additional such dual damascene structures are formed over the structure of FIG. 1 which stack multiple CVD low-k layers A, B over top one another up to bonding pad 24 that is exposed through passivation layer 26 and polyimide layer 28, for example. For simplicity, only a single dual damascene stack series is shown in FIG. 2.

The increased stress caused by this stacking of CVD low-k layers A, B and lowest layers 14, 18, leads to cracking within the CVD low-k layers that leads to degradation of the semiconductor device performance.

BRIEF SUMMARY OF THE INVENTION

The inventors have discovered that the crack resistance of a CVD low-k SiOC material, such as BLACK DIAMOND™ (BD), can be improved over the prior processes by modifying these processes to form low-k SiOCN material by:

increasing the flow of $N_2O$ (to from about 200 to 1000 sccm) to reduce the stress and to improve the crack resistance (increased flow of $N_2O$ was found by the inventors to have no effect on the line to line capacitance);

reducing the process pressure (to from about 0.5 to 3 torr) to reduce the stress from a tensile stress to a compressive stress, and to increase the mean free path (MFP) of the plasma ion bombardment to enhance the crack resistance; and introducing $N_2$ during the deposition of the CVD low-k material layer to create C≡N nitrile bonds (triple carbon—nitrogen bonds) to maintain carbon content; the CVD low-k material having from about 0.1 to 5% C≡N nitrile bonds, and more preferably from about 2–3% C≡N nitrile bonds.

The inventors also studied the effect of deposition/process pressure on the resulting dielectric constant. A 3 torr deposition showed that 110 W has the same dielectric constant as 70 W. Due to the 2.5 torr stronger plasma bombardment, 100 W film has an obvious dielectric increase.

This improvement in crack resistance can mainly be attributed to the reduction of the tensile film stress to a lower compressive film stress. For example, for BD the film stress is reduced from 1.6E9 dyne/cm$^2$ tensile to about −7.4E8 dyne/cm$^2$ compressive.

Further, the cracking threshold may be increased from less than about 2 μm thickness to greater than about 3 μm. The stability of the dielectric constant of the CVD low-k material is also improved.

EMBODIMENTS OF THE PRESENT INVENTION

The Starting CVD Low-k Material for the Present Invention

The Prior CVD low-k material with which the present invention may be used includes materials having the composition:

silicon (Si): from about 15 to 25%;

oxygen (O): from about 25 to 35%;

carbon (C): from about 4% to 14%; and hydrogen (H): from about 31% to 41%.

For example, BLACK DIAMOND (BD) may be used as the Prior CVD low-k SiOC material and has the composition (determined by Rutherford Back Scattering (RBS)):

about 20% silicon;

about 30% oxygen;

about 9% carbon; and about 36% hydrogen.

After altering the process that forms the Prior CVD low-k SiOC material according to the present invention, the resulting CVD low-k SiOCN film/material formed has the following composition that now includes nitrogen:

nitrogen (N): from about 5 to 20%;

silicon (Si): from about 15 to 20%;

oxygen (O): from about 25 to 30%;

carbon (C): from about 5 to 10%; and hydrogen (H): from about 30 to 35%.

For example, altering the BLACK DIAMOND (BD) CVD low-k material process in accordance with the present invention (see below), the resulting low-k SiOCN material has the composition:

about 5% nitrogen;

about 19% silicon;

about 29% oxygen;

about 7% carbon; and about 34% hydrogen.

Prior Processes for the Formation of BLACK DIAMOND (BD)

Two prior processes, Prior Cold Film and Prior Hot Film, have been used to form BD film.

Prior Cold Film Process

In the Prior Cold Film process to form BD, the Starting materials are $MeSiH_3$ (a methyl silane) and $N_2O$, where Me is either 1, 2, 3, or 4 methyl groups, i.e. $MeSiH_3$ may be $CH_3SiH_3$, $(CH_3)_2SiH_2$, $(CH_3)_3SiH$, and $(CH_3)_4Si$. A layer of film is deposited where the molar ratio of $MeSiH_3:N_2O$ is from about 1:2 to 1:10, more preferably from about 1:5 to 1:10, and most preferably from about 1:7 to 1:10. That is, for example:

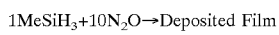

at from about 17 to 400° C. and from about 1 to 3 torr pressure.

The Deposited Film is stabilized by various post anneal or other treatments, i.e.:

helium plasma, from about 15 to 19° C.→BD (as deposited) (and more preferably about 17° C.);

oxygen stabilization, from about 180 to 220° C.→BD (as deposited) (and more preferably about 200° C.); or nitrogen cure, from about 360 to 440° C.→BD (as cured) (and more preferably about 400° C.).

Prior Hot Film Process

In the Prior Hot Film process to form BD, the Starting materials are H—SiMe$_3$ (i.e. trimethyl silane—H—Si(CH$_3$)$_3$), SiH$_4$ (silane), N$_2$O, and optionally O$_2$. The Prior Hot Film BD is formed where the molar ratio of HSiMe$_3$:N$_2$O:SiH$_4$:O$_2$ is from about 1:2:1:0 to 1:10:5:1, more preferably from about 1:5:1:1 to 1:5:3:1, and most preferably from about 1:5:1:1 to 1:5:1:2. That is:

plasma (in helium), from about 360 to 440° C.→BD (more preferably about 400° C.)

and at a pressure from about 1 to 3 torr, and a plasma power of from about 0 to 400 W.

For purposes of illustration, BLACK DIAMOND (BD) will be used as the Prior material whose process is modified in accordance with the present invention to form a CVD low-k SiOCN material, in this case CVD low-k SiOCN BD material, in accordance with the present invention. Other Prior CVD low-k materials, as defined above, may be used with like results.

Structure of BLACK DIAMOND

BLACK DIAMOND (BD) has a SiO$_2$ backbone structure that is, in effect, doped with C, H, i.e. —CH$_3$. The —CH$_3$ doped areas within the BD form micro-voids, or pores, as the SiO$_2$ backbone is interrupted with the —CH$_3$ groups.

The pore radius has been determined to be about 8 angstroms, ±4 angstroms. The total volume fraction of pores within the BD structure is about 36%.

Formation of Final CVD Low-k Material in Accordance With the Present Invention

The key steps of the invention is to form a CVD low-k SiOCN material from modifying the process to form a Prior CVD low-k material while:

increasing the N$_2$O flow rate to from about 150 to 1200 sccm, and more preferably from about 200 to 1000 sccm, with a concomitant change in the relative N$_2$O molar ratio;

reducing the pressure to from about 0.3 to 4 torr, and more preferably from about 0.5 to 3 torr; and introducing N$_2$ at a flow rate from about 1 to 1000 sccm, and more preferably from about 800 to 1000, with a concomitant change in the relative N$_2$ molar ratio. The nitrogen in the C≡N nitrile bond come essentially exclusively from the introduced N$_2$ (a negligible amount may come from the nitrogen in N$_2$O).

Processes for the Formation of CVD Low-k SiOCN Material from BLACK DIAMOND Process The process of the present invention is applied as follows in the formation of CVD low-k SiOCN BLACK DIAMOND (BD) in the Final Cold Film and Final Hot Film processes.

First Embodiment—Final Cold Film Process

In the first embodiment, a Final Cold Film process is used to form CVD low-k SiOCN BD the Starting materials are MeSiH$_3$ (a methyl silane), where Me is either 1, 2, 3, or 4 methyl groups, i.e. MeSiH$_3$ may be CH$_3$SiH$_3$, (CH$_3$)$_2$SiH$_2$, (CH$_3$)$_3$SiH, and (CH$_3$)$_4$Si, N$_2$O, and in a key step of the invention, N$_2$ is also introduced. A layer of film is deposited where the molar ratio of MeSiH$_3$:N$_2$O:N$_2$ is from about 1:2:10 to 1:10:15, more preferably from about 1:5:10 to 1:10:15, and most preferably from about 1:7:10 to 1:10:15;

MeSiH$_3$+N$_2$O+N$_2$→Final Deposited Film.

For example, the flow rate of MeSiH$_3$ may be from about 1 to 70 sccm. The flow rate of N$_2$O is increased from the Prior Cold Film process to from about 150 to 1200 sccm, and more preferably from about 200 to 1000 sccm. The flow rate of N$_2$ may be from about 10 to 1000 sccm, and more preferably from about 500 to 1000 sccm. The pressure is reduced from the Prior Cold Film process to from about 0.3 to 4 torr, and more preferably from about 0.5 to 3 torr. The plasma power may be from about 0 to 400 W. An Applied Materials AMAT CVD tool may be used.

The Final Deposited Film is stabilized by various post anneal or other treatments as is done in the conventional Cold Film formation of BD to form CVD low-k SiOCN BD, i.e.:

helium plasma, from about 15 to 19° C.→CVD low-k SiOCN BD (as deposited) (and more preferably about 17° C.);

oxygen stabilization, from about 180 to 220° C.→CVD low-k SiOCN BD (as deposited) (and more preferably about 200° C.); or nitrogen cure, from about 360 to 440° C.→CVD low-k SiOCN BD (as cured) (and more preferably about 400° C.).

Second Embodiment—Hot Film Process

In the second embodiment, a Hot Film process is used to form CVD low-k SiOCN BD the Starting materials are H-SiMe$_3$ (i.e. trimethyl silane—H—Si(CH$_3$)$_3$), SiH$_4$ (silane), N$_2$O, and optionally O$_2$, and in a key step of the invention, N$_2$ is also introduced. A layer of CVD low-k SiOCN film is formed where the molar ratio of HSiMe$_3$:N$_2$O:SiH$_4$:O$_2$ is from about 1:2:1:0 to 1:10:5:1, more preferably from about 1:5:1:1 to 1:5:1:2. That is:

H—SiMe$_3$+N$_2$O+O$_2$ (optional)+N$_2$ plasma (in helium), from about 360 to 440° C.→CVD low-k SiOCN BD.

For example, the flow rate of O$_2$ (optional) may be from about 0 to 20 sccm. The plasma power is from about 0 to 400 W, and more preferably from about 200 to 300 W. The other parameters are the same as in the Final Cold Film process, i.e. the flow rate of MeSiH$_3$ may be from about 1 to 70 sccm. The flow rate of N$_2$O is increased from the Prior Cold Film process to from about 150 to 1200 sccm, and more preferably from about 200 to 1000 sccm. The flow rate of N$_2$ may be from about 1 to 1000 sccm, and more preferably from about 500 to 1000 sccm. The pressure is reduced from the Prior Cold Film process to from about 0.3 to 4 torr, and more preferably from about 0.5 to 3 torr.

In the above example O$_2$—N$_2$ may be substituted for N$_2$O in the appropriate ratios.

Regardless of whether a Final Cold Film process or Final Hot Film process is used to form the CVD low-k SiOCN BD material, the CVD low-k SiOCN BD material has the composition:

nitrogen (N): from about 5 to 20%;

silicon (Si): from about 15 to 20%;

oxygen (O): from about 25 to 30%;

carbon (C): from about 5 to 10%; and hydrogen (H): from about 30 to 35%.

Figure 3:
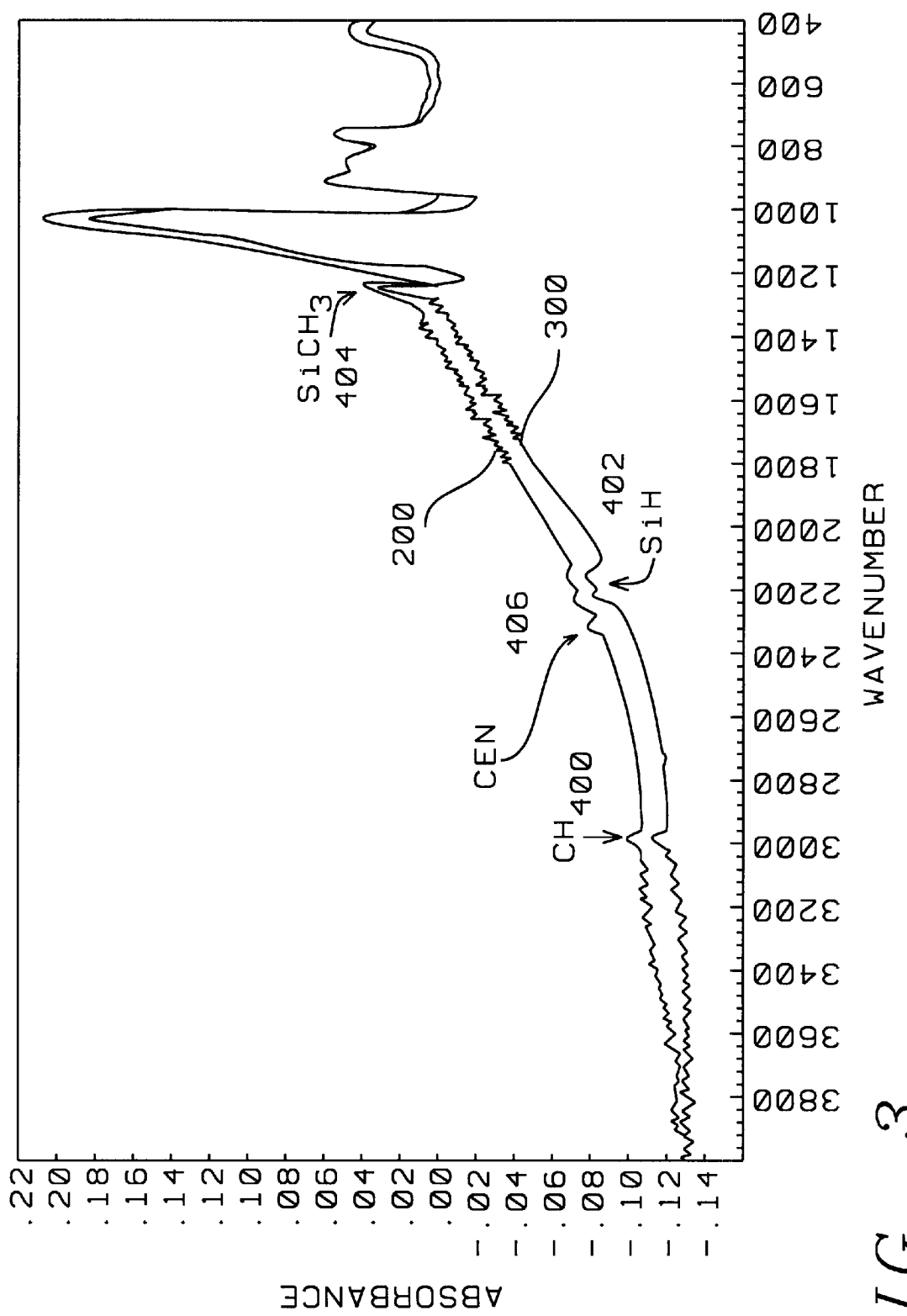
FIG. 3 is a Fourrier Transform Infrared (FTIR) graph of a CVD low-k SiOCN material formed in accordance with the present invention superimposed over a FTIR graph of a CVD low-k material not so formed.

FIG. 3 is an illustrative FTIR graph 200 (absorbance v. wavenumber) of CVD low-k SiOCN material made in accordance with the present invention essentially superimposed over an FTIR graph 300 of the corresponding Prior CVD low-k material. Specifically, FIG. 3 illustrates a FTIR graph 200 of CVD low-k SiOCN BD material 200 superimposed over a FTIR graph 300 of Prior BD 300. Each FTIR graph 200, 300 identifies the wavenumbers of CH bonds 400, SiH bonds 402, and SiCH$_3$ bonds 404, for example, at the of a CVD low-k material.

Regardless of whether the Final Cold Film process or Final Hot Film process is used to form the CVD low-k SiOCN BD material, C≡N nitrile bonds are formed in the CVD low-k SiOCN BD material. The C≡N nitrile bonds would be indicated at about wavenumber 2330.162 on the FTIR graph of FIG. 3. As is readily apparent, C≡N nitrile bonds at 406 are present only in the CVD low-k SiOCN BD material FTIR graph 200, and not in the Prior BD FTIR graph 300. Similar results would be found for other CVD low-k SiOCN material formed in accordance with the present invention.

Advantages of the Present Invention

Increasing the $N_2O$ flow rate (range from about 200 to 1000 sccm) can dramatically reduce the stress to improve the crack resistance.

Carbon content is maintained in the film via the strong C≡N nitrile bonding, as such more air (voids) are created in the structure which reduces the dielectric constant (k) of the film. (Since air has lowest k (dielectric constant) value, the more air volume the lower the k value.)

Reducing the process pressure (range from about 0.5 to 3 torr) can dramatically reduce the stress from tensile to compressive and increase the mean free path (MFP) plasma ion bombardment to enhance the film crack resistance.

Prior BD film has a tensile stress of about 1.6E09 dyne/$cm^2$, and over several process steps (e.g. depositing, etching, photoresist ashing, wet cleaning, and copper bake) an undesirable wide stress variation may occur. The CVD low-k SiOCN BD film fabricated in accordance with the present invention has a compressive stress of about −7.4E08 dyne/$cm^2$, a significant improvement, and has less of a stress variation over those process steps. (Stress above 0.0E (positive) denotes tensile stress and stress below 0.0E (negative) denotes compressive stress.)

Metal always has tensile stress so using a dielectric film with compressive stress in conjunction with metal, compensates for the metal's tensile stress and tends to maintain an overall planar structure, thus reducing the risk of cracking.

This improvement in stress, to about −7.4E08 dyne/$cm^2$ for CVD low-k SiOCN BD, improves the crack resistance of the CVD low-k SiOCN material increasing the cracking threshold to greater than about 3 μm overall thickness from less than 2 μm for Prior BD, for example.

For example, a Prior BD film, i.e. a 2.8 μm thick Applied Material's BD film made by the best known method, showed severe cracking, while a 2.8 μm thick CVD low-k SiOCN BD film made in accordance with the present invention showed no discernable cracking.

This also held true for a diamond head tool drop indent test testing the mechanical strength of Prior BD film and CVD low-k SiOCN BD film. When such a test was conducted, applying approximately 0.5 Newtons force against a Prior BD film, severe cracking radiating from the impact point was observed while a CVD low-k SiOCN BD film showed dramatic improvement.

The CVD low-k SiOCN film made in accordance with the present invention also maintains the Prior CVD low-k film's low dielectric constant characteristics. For example, in the case of BD, Prior BD has a final dielectric constant after processing of about 3.22 while the CVD low-k SiOCN BD made in accordance with the present invention has a final dielectric constant after processing of about 3.45. This is acceptable in light of the decreased stress of the CVD low-k SiOCN BD film to about −7.4E08 dynes/$cm^2$. The 3.45 dielectric constant may be further reduced by post treatment of the film.

Further the dielectric constant stability of the CVD low-k SiOCN BD film during further processing is improved over the Prior BD film.

Introducing $N_2$ during deposition can create C≡N nitrile bonds to maintain carbon content and create dielectric constant (k) stability. Therefore one needs C in low-k dielectric materials.

Increasing $N_2O$ improves the compressive strength of the film and so increases cracking resistance by compensating for the tensile stress of metal.

It is noted that the processes disclosed herein may be scaled up or scaled down while maintaining the molar ratios.

While particular embodiments of the present invention have been illustrated and described, it is not intended to limit the invention, except as defined by the following claims.

We claim:

1. A method of fabricating a CVD low-k SiOCN material, comprising the steps of:
   reacting $MeSiH_3$, $N_2O$, and $N_2$ at a molar ratio of from about 1:2:10 to 1:10:15 and at a plasma power from about 0 to 400 W to deposit a final deposited film; and
   treating said final deposited film to stabilize said final deposited film and form a CVD low-k SiOCN material.

2. The method of claim 1, wherein said molar ratio of $MeSiH_3:N_2O:N_2$ is from about 1:5:10 to 1:10:15, said pressure is from about 0.5 to 3 torr, said temperature is from about 17 to 35° C., and said plasma power is from about 20 to 200 W.

3. The method of claim 1, wherein said CVD low-k SiOCN material has a structure that includes from about 0.1 to 5% C≡N nitrile bonds.

4. The method of claim 1, wherein said CVD low-k SiOCN material has a cracking threshold of at least 2 μm, and said $MeSiH_3$, $N_2O$, and $N_2$ reaction includes a pressure from about 0.3 to 4 torr and at a temperature from about 17 to 400° C.

5. The method of claim 1, wherein said CVD low-k SiOCN material has a cracking threshold of from about 2 to 3 μm.

6. The method of claim 1, wherein said CVD low-k SiOCN material has a cracking threshold of at least 3 μm.

7. The method of claim 1, wherein said stabilization treatment of said final deposited film includes a helium plasma treatment at from about 15 to 19° C.

8. The method of claim 1, wherein said stabilization treatment of said final deposited film includes an oxygen stabilization treatment at from about 180 to 220° C.

9. The method of claim 1, wherein said stabilization treatment of said final deposited film includes a nitrogen cure at from about 360 to 440° C.

10. A method of fabricating a CVD low-k SiOCN material, comprising the steps of:
    reacting $MeSiH_3$, $N_2O$, and $N_2$ at a molar ratio of from about 1:5:10 to 1:10:15, at about 17 to 400° C., and at a plasma power from about 0 to 400 W to deposit a final deposited film; and
    treating said final deposited film to stabilize said final deposited film and form a CVD low-k SiOCN material having a structure that includes from about 0.1 to 5% C≡N nitrile bonds.

11. The method of claim 10, wherein said molar ratio of $MeSiH_3:N_2O:N_2$ is from about 1:5:10 to 1:10:15, said pressure is from about 0.5 to 3 torr, said temperature is from about 17 to 25° C., said plasma power is from about 20 to 200 W, and said SiOCN structure has from about 0.1 to 5% C≡N nitrile bonds.

12. The method of claim 10, wherein said CVD low-k SiOCN material has a cracking threshold of at least 2 μm.

13. The method of claim 10, wherein said CVD low-k SiOCN material has a cracking threshold of from about 2 to 3 μm.

14. The method of claim 10, wherein said CVD low-k SiOCN material has a cracking threshold of at least 3 µm.

15. The method of claim 10, wherein said stabilization treatment of said final deposited film includes a helium plasma treatment of about 15 to 19° C.

16. The method of claim 10, wherein said stabilization treatment of said final deposited film includes an oxygen stabilization treatment at from about 180 to 220° C.

17. The method of claim 10, wherein said stabilization treatment of said final deposited film includes a nitrogen cure at from about 360 to 440° C.

18. A method of fabricating a CVD low-k material, comprising the steps of:

reacting a starting mixture of $MeSiH_3$, $SiH_4$, $N_2O$, and $N_2$ at a molar ratio of from about 1:1:2:10 to 1:1:10:15, at a temperature from about 380 to 420° C., and in a plasma in a helium carrier gas at a plasma power from about 0 to 400 W to deposit a CVD low-k SiOCN material.

19. The method of claim 18, wherein said molar ratio of $MeSiH_3:SiH_4:N_2O:N_2$ is from about 1:1:7:10 to 1:1:10:15, said pressure is from about 0.5 to 3 torr, said temperature is from about 390 to 410° C., and said plasma power is from about 70 to 200.

20. The method of claim 18, wherein said CVD low-k SiOCN material has a structure that includes from about 0.1 to 5% C≡N nitrile bonds, and said $MeSiH_3$, $SiH_4$, $N_2O$, and $N_2$ reaction includes a pressure from about 0.3 to 4 torr.

21. The method of claim 18, wherein said CVD low-k SiOCN material has a cracking threshold of at least 2 µm.

22. The method of claim 18, wherein said CVD low-k SiOCN material has a cracking threshold of from about 2 to 3 µm.

23. The method of claim 18, wherein said final CVD low-k material has a cracking threshold of at least 3 µm.

24. The method of claim 18, wherein said starting mixture further includes $O_2$, and wherein the molar ratio of $MeSiH_3:SiH_4:N_2O:N_2$—$O_2$ is from about 1:2:1:10-1 to 1:5:10:15-2.

25. The method of claim 18, wherein said starting mixture further includes $O_2$, and wherein the molar ratio of $MeSiH_3:SiH_4:N_2O:N_2$—$O_2$ is from about 1:5:1:10-1 to 1:5:10:15-2, said pressure is from about 0.5 to 3 torr, said temperature is from about 390 to 410° C., and said plasma power is from about 70 to 200.

26. A method of fabricating a CVD low-k material, comprising the steps of:

reacting a starting mixture of $MeSiH_3$, $SiH_4$, $N_2O$, and $N_2$ at a molar ratio of from about 1:1:5:10 to 1:5:10:15, at a pressure from about 0.3 to 4 torr, at a temperature from about 380 to 420° C., and in a plasma in a helium carrier gas at a plasma power from about 0 to 400 W to deposit a CVD low-k SiOCN material having a structure that includes from about 0.1 to 5% C≡N nitrile bonds.

27. The method of claim 26, wherein said molar ratio of $MeSiH_3:SiH_4:N_2O:N_2$ is from about 1:1:5:10 to 1:2:10:15, said pressure is from about 0.5 to 3 torr, said temperature is from about 390 to 410° C., and said plasma power is from about 70 to 200 W.

28. The method of claim 26, wherein said CVD low-k SiOCN material has a cracking threshold of at least 2 µm.

29. The method of claim 26, wherein said CVD low-k SiOCN material has a cracking threshold of from about 2 to 3 µm.

30. The method of claim 26, wherein said final CVD low-k material has a cracking threshold of at least 3 µm.

31. The method of claim 26, wherein said starting mixture further includes $O_2$, and wherein the molar ratio of $MeSiH_3:SiH_4:N_2O:N_2$—$O_2$ is from about 1:1:5:10-1 to 1:1:10:15-1.

32. The method of claim 26, wherein said starting mixture further includes $O_2$, and wherein the molar ratio of $MeSiH_3:SiH_4:N_2O: N_2$—$O_2$ is from about 1:1:5:10-1 to 1:1:10:15-2, said pressure is from about 0.5 to 3 torr, said temperature is from about 390 to 410° C., and said plasma power is from about 70 to 200 W.

* * * * *